(12) United States Patent
Wong et al.

(10) Patent No.: US 8,385,710 B2
(45) Date of Patent: Feb. 26, 2013

(54) FIBER TRAY

(75) Inventors: Thomas Chung Yin Wong, Chicago, IL (US); Mark J. Donnell, Orland Park, IL (US); David C. Kilinskis, Downers Grove, IL (US)

(73) Assignee: Panduit Corp., Tinley Park, IL (US)

( * ) Notice: Subject to any disclaimer, the term of this patent is extended or adjusted under 35 U.S.C. 154(b) by 81 days.

(21) Appl. No.: 12/941,489

(22) Filed: Nov. 8, 2010

(65) Prior Publication Data

US 2011/0109213 A1 May 12, 2011

Related U.S. Application Data

(60) Provisional application No. 61/260,680, filed on Nov. 12, 2009.

(51) Int. Cl.
*G02B 6/00* (2006.01)
(52) U.S. Cl. ........................ 385/135; 385/134
(58) Field of Classification Search .................. 385/134, 385/135, 136
See application file for complete search history.

(56) References Cited

U.S. PATENT DOCUMENTS

| | | | |
|---|---|---|---|
| 4,420,197 A | 12/1983 | Dreiling | |
| 4,737,039 A | 4/1988 | Sekerich | |
| 5,127,082 A | 6/1992 | Below et al. | |
| 5,954,301 A | 9/1999 | Joseph et al. | |
| 6,209,979 B1 | 4/2001 | Fall et al. | |
| 6,601,933 B1 | 8/2003 | Greenwald | |
| 6,748,155 B2 | 6/2004 | Kim et al. | |
| 6,944,383 B1 | 9/2005 | Herzog et al. | |
| 6,944,389 B2 | 9/2005 | Giraud et al. | |
| 7,027,706 B2 | 4/2006 | Diaz et al. | |
| 7,200,316 B2 | 4/2007 | Giraud et al. | |
| 7,382,623 B2 | 6/2008 | Hartman | |
| 7,397,996 B2 | 7/2008 | Herzog et al. | |
| 7,409,137 B2 | 8/2008 | Barnes | |
| 7,437,049 B2 | 10/2008 | Krampotich | |
| 7,480,438 B2 | 1/2009 | Douglas et al. | |
| 7,509,015 B2 | 3/2009 | Murano | |
| 7,513,581 B1 | 4/2009 | Baiza et al. | |
| 2006/0018622 A1* | 1/2006 | Caveney et al. | 385/135 |
| 2007/0058918 A1* | 3/2007 | Trebesch et al. | 385/135 |
| 2008/0085094 A1* | 4/2008 | Krampotich | 385/135 |

FOREIGN PATENT DOCUMENTS

WO 2009032245 A1 3/2009

OTHER PUBLICATIONS

Panduit Part No. FRME1U Product Overview; webpages from www.panduit.com; 2 pages; Nov. 4, 2009.
Panduit Part No. FCE1U Product Overview; webpages from www.panduit.com; 2 pages; Nov. 4, 2009.
Panduit Opticom® Trays, Drawers and Preloaded Trays Specification Sheet, webpages from www.panduit.com; 2 pages; Jan. 2005.

* cited by examiner

*Primary Examiner* — Brian Healy
*Assistant Examiner* — Mary El Shammaa
(74) *Attorney, Agent, or Firm* — Robert A. McCann; Christopher S. Clancy; Aimee E. McVady (57) ABSTRACT

A fiber tray for managing and organizing fiber distribution is disclosed. The fiber tray includes a housing and a drawer received in the housing. The housing is secured to an equipment rack. The housing includes inner sides with a glide mechanism extending the length of each inner side. The glide mechanism includes a first end and a second end. The glide mechanism also includes at least one curved path located at one of the first end and the second end. The drawer includes a bottom, a first side, a second side, a front and a back. The first and second sides of the drawer have a pin. The pins extending from the sides of the drawer slide within the glide mechanism to enable the drawer to be retracted, extended or removed from the housing.

8 Claims, 9 Drawing Sheets

FIBER TRAY

CROSS-REFERENCE TO RELATED APPLICATIONS

This application claims priority to U.S. Provisional Application No. 61/260,680, filed Nov. 12, 2009, the subject matter of which is hereby incorporated by reference in its entirety.

FIELD OF THE INVENTION

The present invention relates to a fiber tray, and more particularly to a glide mechanism for a drawer in a fiber tray.

BACKGROUND OF THE INVENTION

Fiber trays are designed to manage and organize fiber distribution in areas where space is limited. The fiber trays include housings installed on a rack. A drawer extends from the housing to provide access to the cables routed therein. A fully installed drawer, however, is difficult to maintain in an extended position due to the weight of the fibers and fiber management accessories installed on the drawer. Also, drawers that do not positively stop can cause damage to the fiber if the drawer is unintentionally removed. Thus, it would be desirable to install a drawer that is capable of remaining in an extended position.

Often, it is necessary to remove the drawer for cable management and to reinstall the drawer. Some drawers are difficult to remove or are permanently fixed to a housing which does not provide enough space for fiber installation. Thus, it would also be desirable for a drawer to be easily removed from the housing and to be easily reinstalled in the housing.

SUMMARY OF THE INVENTION

A fiber tray that manages and organizes fiber distribution is disclosed. The fiber tray includes a housing and a drawer received in the housing. The housing is secured to a rack. The housing includes inner sides with a glide mechanism that extends the length of each inner side. The glide mechanism includes a first end and a second end. The glide mechanism also includes at least one curved path located at one of the first end and the second end. The drawer includes a bottom, a first side, a second side, a front and a back. The first and second sides of the drawer have a pin that slides within the glide mechanism. The glide mechanism enables the drawer to slide between a retracted position and a fully extended service position. The glide mechanism also enables the drawer to be removed from the housing and to be reinstalled in the housing.

DETAILED DESCRIPTION

Figure 1:
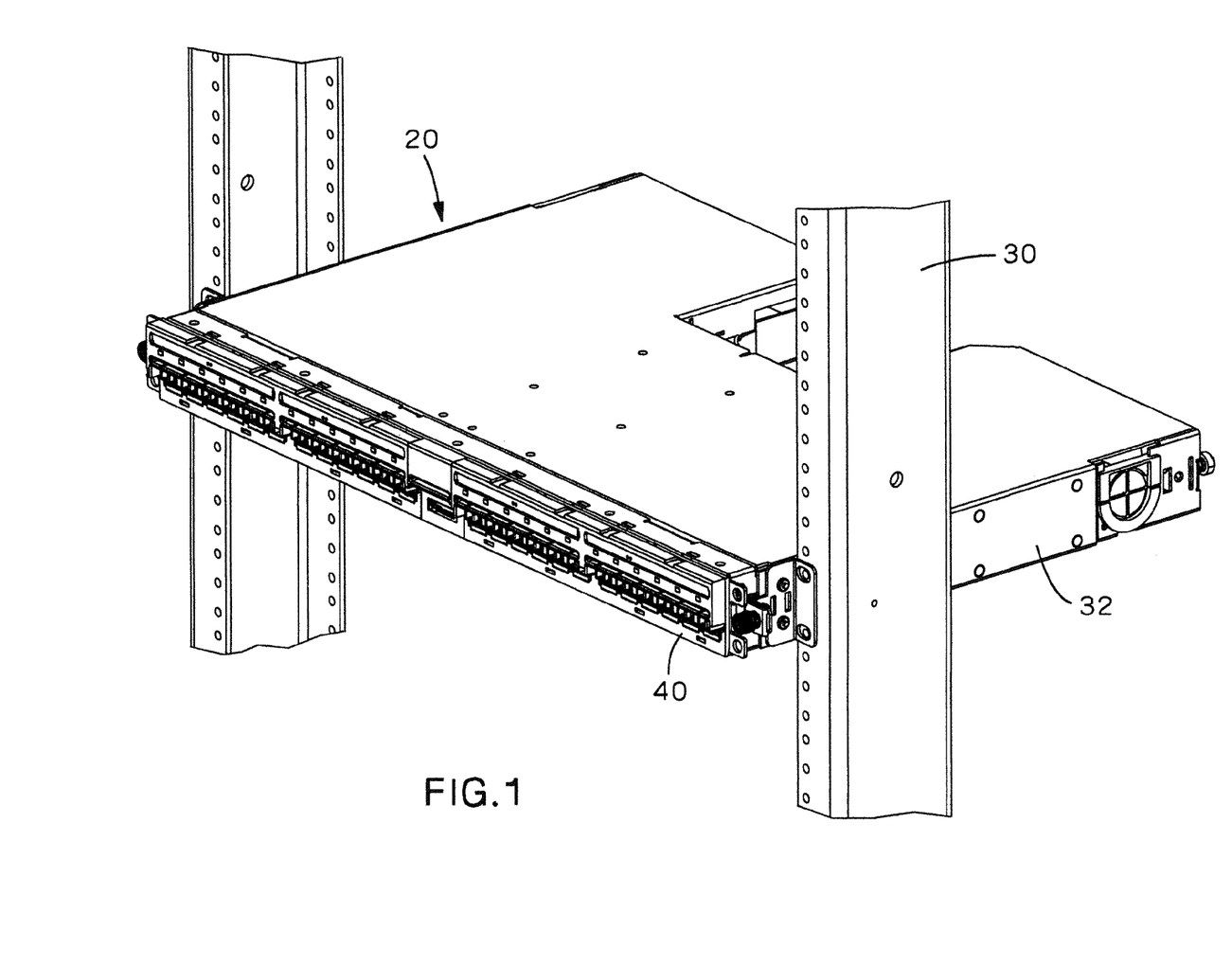
FIG. 1 is a perspective view of a fiber tray installed on a section of a rack.
Figure 2:
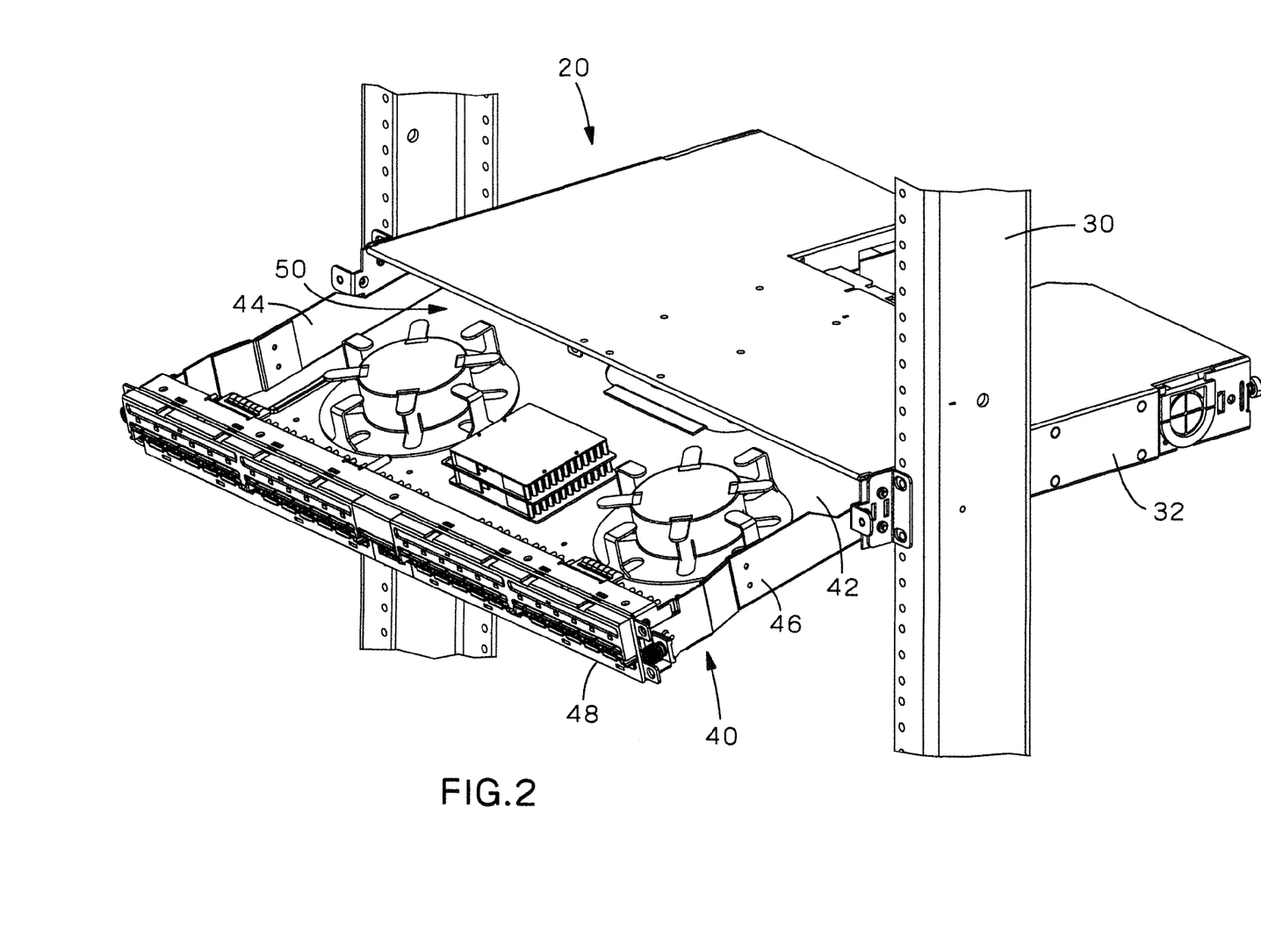
FIG. 2 is a perspective view of the fiber tray of FIG. 1 with a drawer fully extended from the housing.
Figure 3:
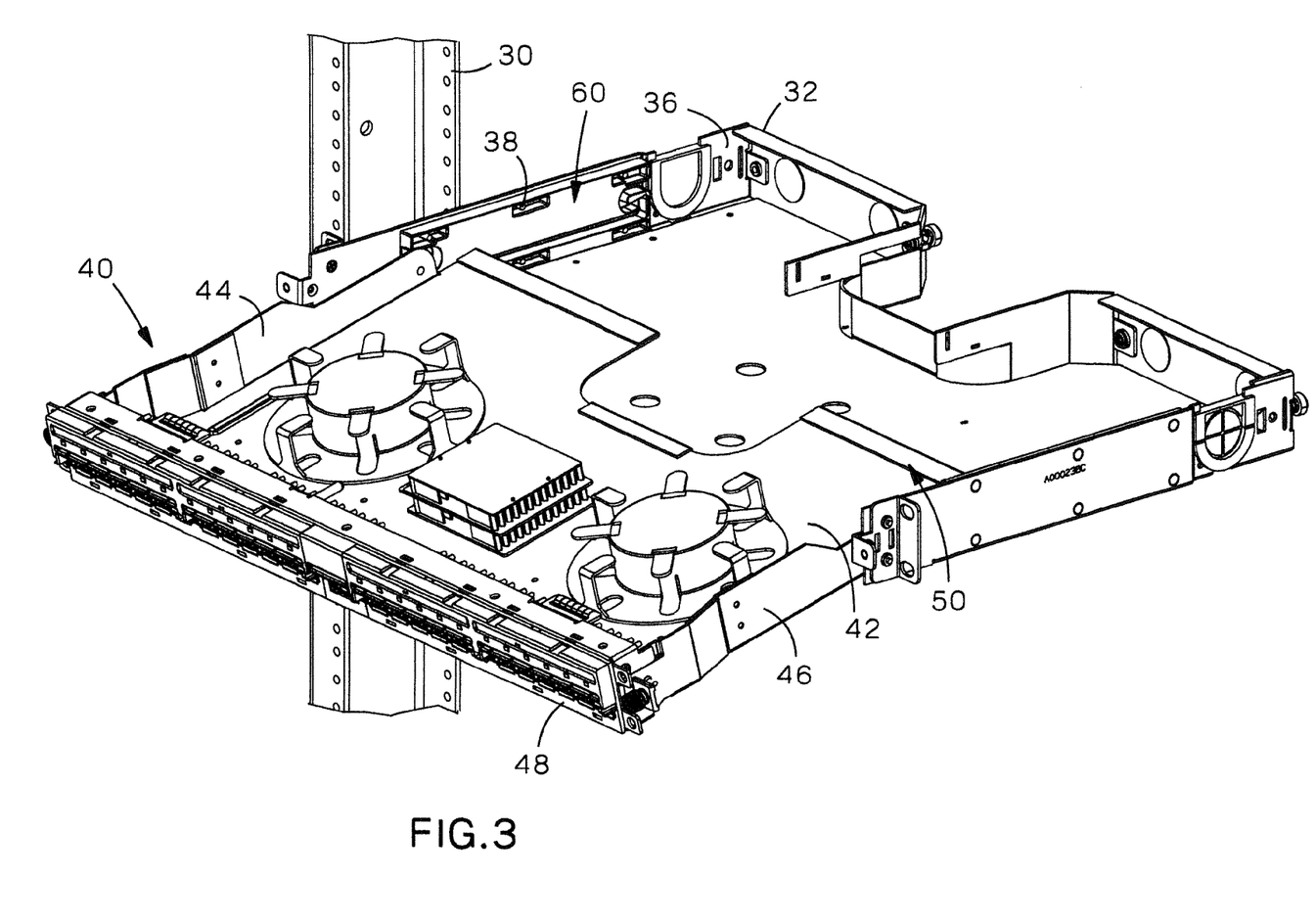
FIG. 3 is a perspective view of the drawer and housing of FIG. 2 with the top of the housing removed.

FIGS. 1-3 illustrate a fiber tray 20 including a housing 32 secured to a rack 30. A drawer 40 extends from the housing 32. The drawer 40 is a sheet metal drawer with a bottom 42, a right or first side 44, a left or second side 46, a front 48 and an open rear or back 50. Each side 44, 46 of the drawer 40 includes a hinge pin 52. As illustrated in FIG. 4B, the hinge pins 52 are located near the rear 50 of each side 44, 46 of the drawer 40. Each hinge pin 52 is a self-clinching hinge pin.

As illustrated in FIG. 3, a glide mechanism 60 is positioned along the inner sides 36 of the housing 32. The glide mechanisms 60 are secured to the inner sides 36 of the housing 32 via fasteners 38. The glide mechanisms 60 enable the drawer 40 to slide between a retracted position and a fully extended service position. The glide mechanisms 60 also enable the drawer 40 to easily be removed from the housing 32 and to be reinstalled in the housing 32, as desired.

Figure 4A:
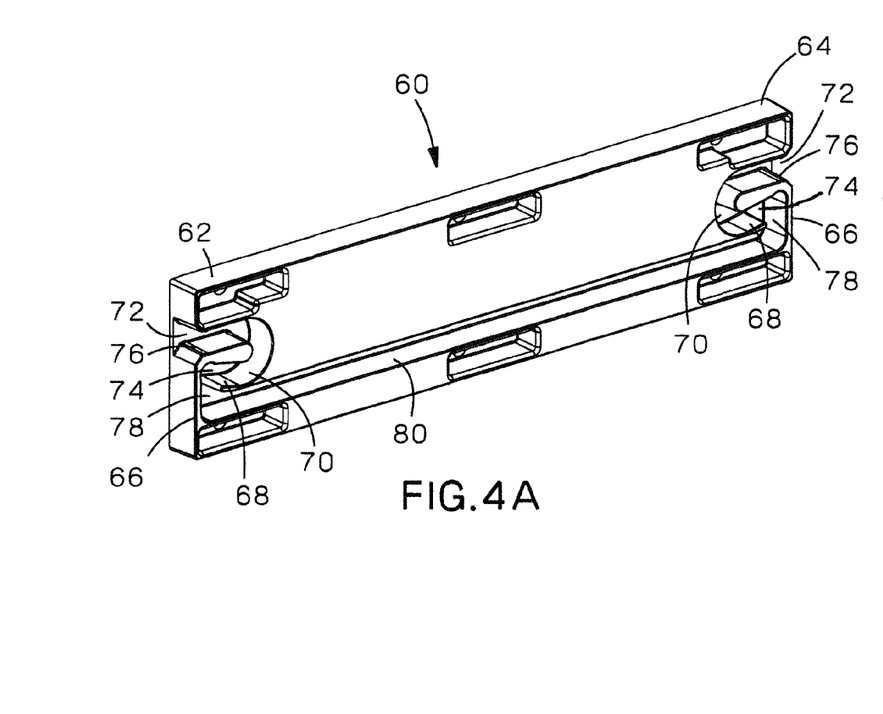
FIG. 4A is a side perspective view of the glide mechanism of the present invention to be installed on the inner sides of the housing of FIG. 3.
Figure 4B:
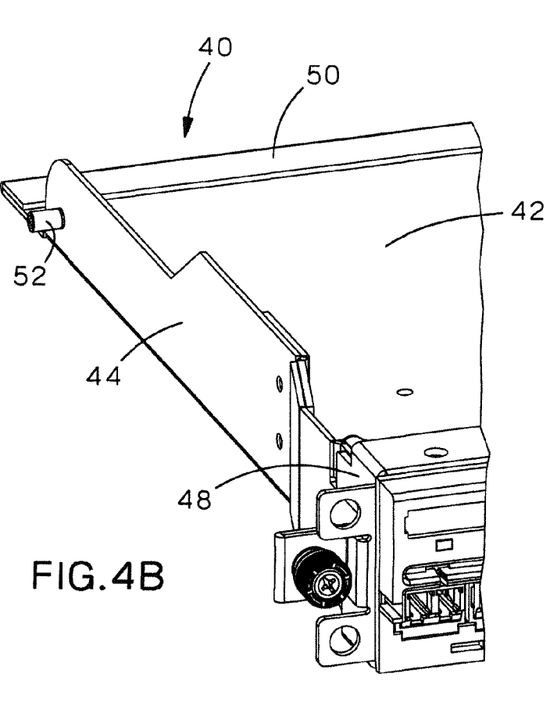
FIG. 4B is a partial perspective view of a side of the drawer of FIG. 3.

As illustrated in FIG. 4A, the glide mechanism 60 includes a primary stopping wall 66, a secondary restraining wall 68 and a curved path 70 at each end 62, 64 of the glide mechanism 60. The curved path 70 is generally C-shaped with a first open end 72 and a second end 74. A projection or bump 76 is located at the first open end 72 of the curved path 70. The projection 76 is for controlling the drawer 40 when removed or installed in the housing 32.

A vertical path 78 extends from the second end 74 of the curved path 70 to a straight path 80. The straight path 80 extends from the primary stopping walls 66 at each end 62, 64 of the glide mechanism 60 connecting the curved paths 70 in the glide mechanism 60.

The primary stopping wall 66 of the glide mechanism 60 forces the drawer 40 to stop once it is fully extended from the housing 32 before the drawer 40 can be removed from the housing 32. The secondary restraining wall 68 prevents the drawer 40 from accidentally slipping into the curved path 70 before the drawer 40 comes to a stop. The generally C-shaped curved path 70 limits unintentional movement of the drawer 40. Thus, the primary stopping wall 66, secondary restraining wall 68 and curved path 70 provide a mechanism that controls and maintains the movement of the drawer 40. As a result, a separate locking mechanism is not required to maintain the drawer 40 in the extended or retracted positions.

The symmetry feature of the glide mechanism 60 allows the glide mechanism 60 to be used on either the left side or the right side of the housing 32. Since only one glide mechanism design is required, the cost of providing the glide mechanisms 60 in the fiber tray 20 is reduced.

Figure 5:
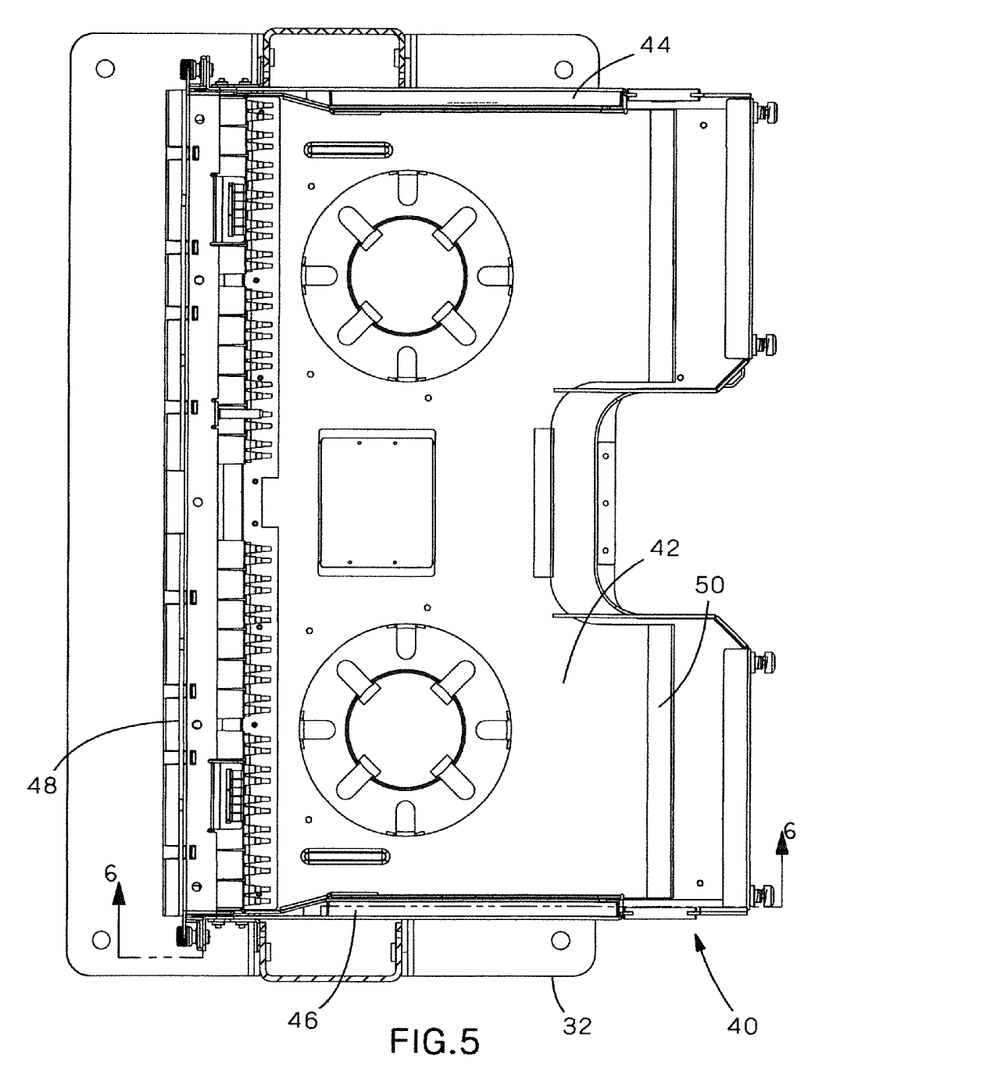
FIG. 5 is a top view of the drawer installed in the housing of FIG. 1 with the top of the housing removed.
Figure 6:
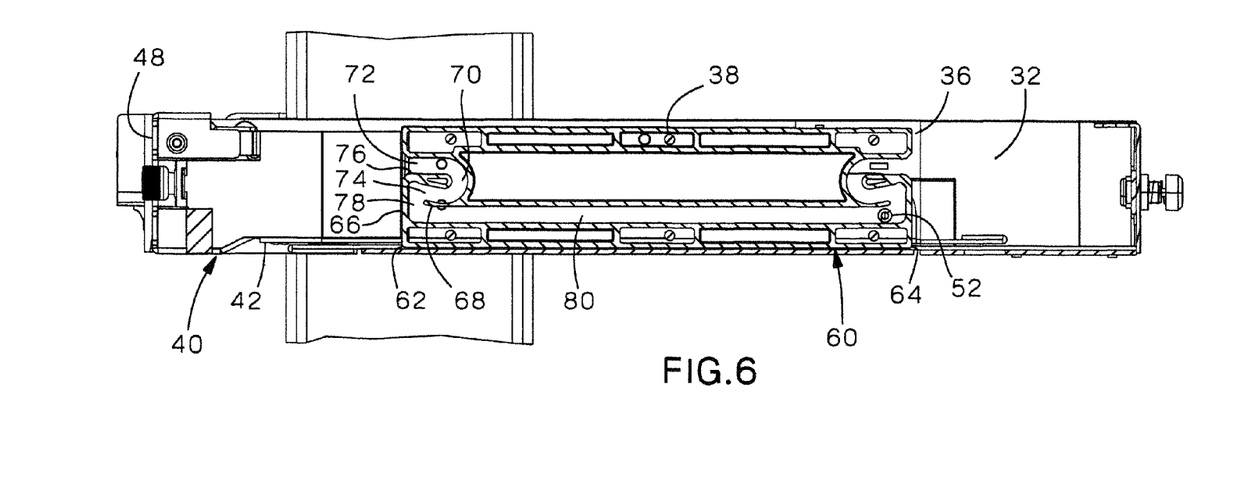
FIG. 6 is a cross-sectional view of the drawer installed in the housing taken along line 6-6 of FIG. 5.

FIGS. 5-6 illustrate the drawer 40 in a retracted position. The hinge pins 52 extending from the sides 44, 46 of the drawer 40 are located in the straight path 80 at a second end 64 of the glide mechanism 60.

Figure 7:
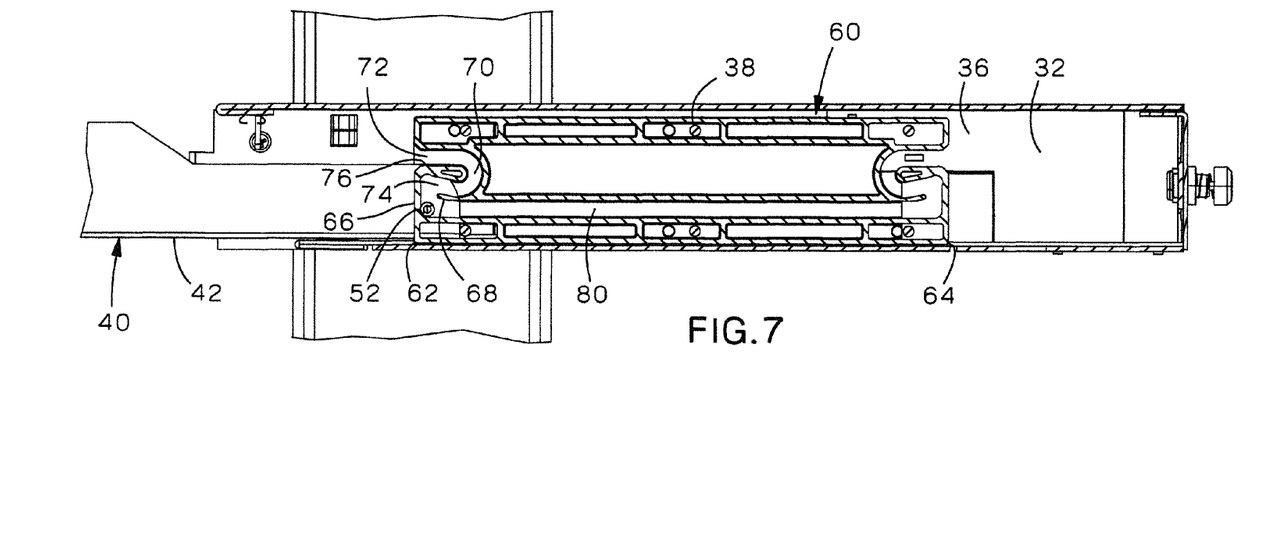
FIG. 7 is a cross-sectional view of the drawer of FIG. 5 in an extended position.
Figure 8:
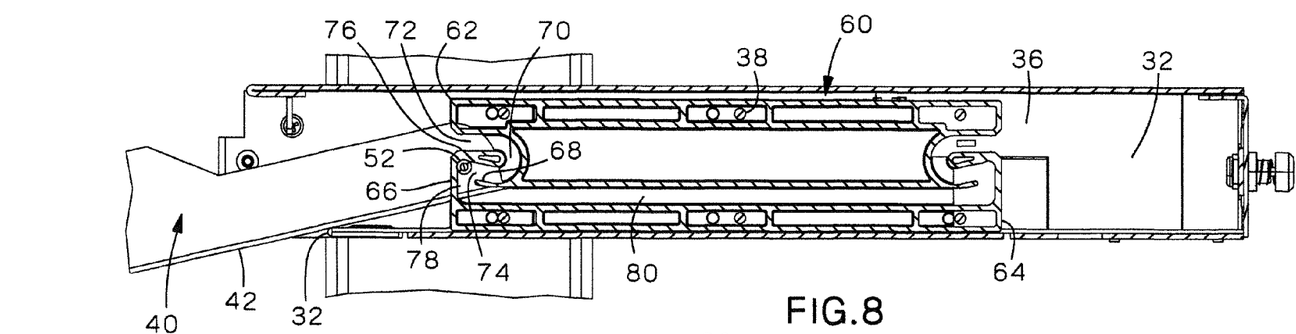
FIG. 8 is a cross-sectional view of the drawer of FIG. 5 in a service position.
Figure 9:
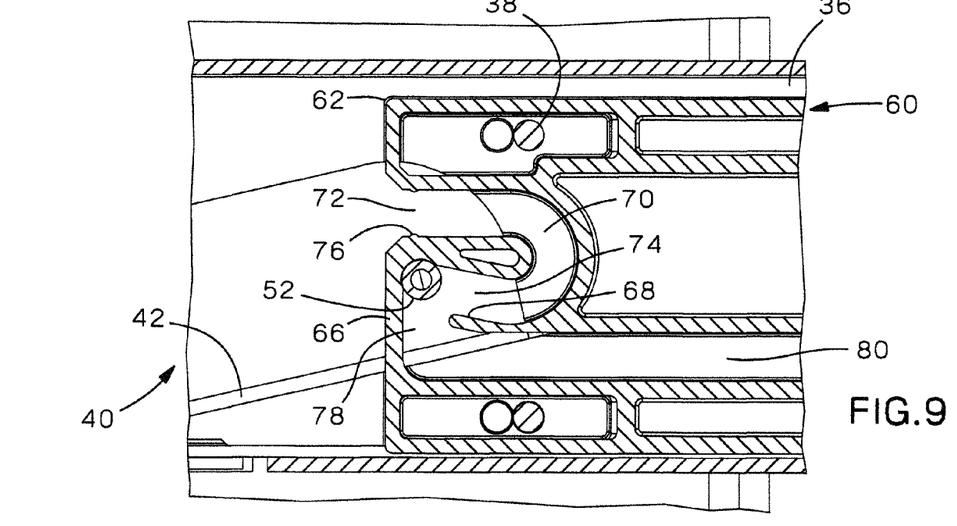
FIG. 9 is a detailed view of the drawer of FIG. 8 with the hinge pin engaging a primary stopping wall in the glide mechanism.

FIG. 7 illustrates the drawer 40 in a fully extended position. The hinge pins 52 extending from the sides 44, 46 of the drawer 40 are located in the straight path 80 at a first end 62 of the glide mechanism 60. As illustrated in FIGS. 8 and 9, when the drawer 40 is fully extended, the drawer 40 will tilt downward to a service position and lock in place due to the effect of gravity on the drawer 40. The hinge pins 52 engage the primary stopping wall 66 to stop the drawer 40 and prevent the drawer 40 from falling or sliding out of the glide mechanism 60. As illustrated in FIG. 8, the bottom 42 of the drawer 40 rests on the housing 32.

Figure 10:
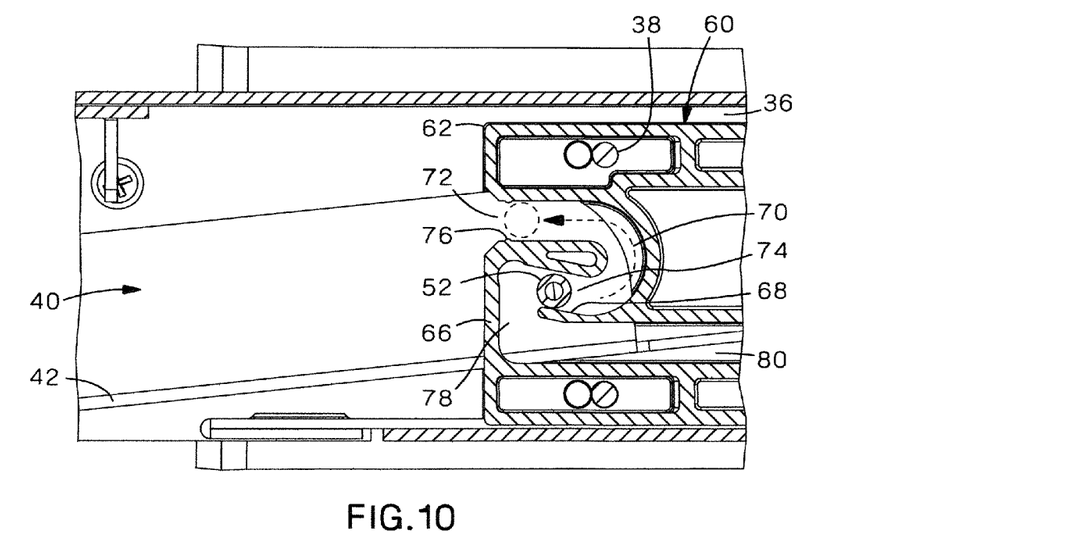
FIG. 10 is a detailed view of the drawer similar to FIG. 9 with the hinge pin at a second end of the curved path of the glide mechanism.
Figure 11:
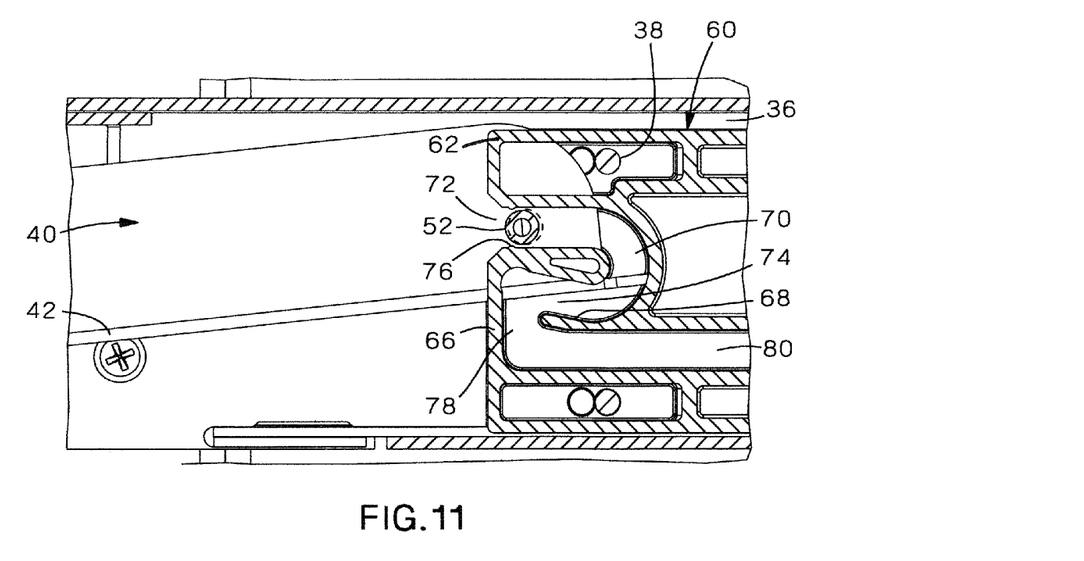
FIG. 11 is a detailed view of the drawer similar to FIG. 9 with the hinge pin at a first end of the curved path of the glide mechanism.
Figure 12:
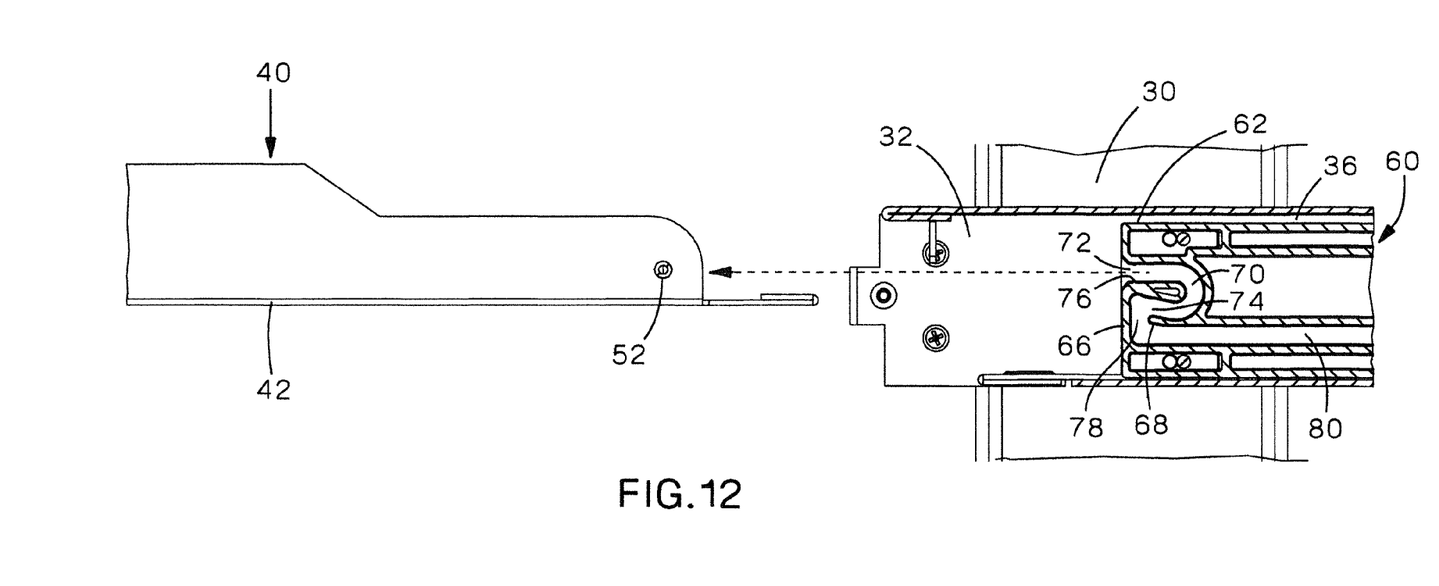
FIG. 12 is a detailed view of the drawer of FIG. 9 removed from the housing.

FIGS. 10-12 illustrate the drawer 40 being removed from the housing 32. To remove the drawer 40, the user guides the drawer 40 so that the hinge pins 52 follow the curved path 70 in the glide mechanism 60.

The process of installing the drawer 40 into the housing 32 is the opposite of the removal of the drawer 40. The user lines up the hinge pins 52 with the first end 72 of the curved path 70 of the glide mechanism 60. Next, the drawer 40 is moved such that the hinge pins 52 slide along the curved path 70 until the hinge pins 52 reach the second end 74 of the curved path 70. At that point the drawer 40 is level and the hinge pins 52 drop down the vertical path 78 into the straight path 80 of the glide mechanism 60. Then, the drawer 40 may be pushed back into the housing 32 along the straight path 80 to the retracted position.

Thus, the glide mechanism 60 of the present invention facilitates the removal and the installation of a drawer 40 in the housing 32.

Furthermore, while the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation. The actual scope of the invention is intended to be defined in the following claims when viewed in their proper perspective based on the prior art.

The invention claimed is:

1. A fiber tray for managing fiber distribution, the fiber tray comprising:
    a housing adapted to be secured to a rack, the housing including inner sides with a glide mechanism extending a length of the inner sides;
    the glide mechanism includes a first end and a second end, wherein the glide mechanism includes at least one curved path at one of the first end and the second end; and
    a drawer received in the housing, the drawer including a bottom, a first side, a second side, a front and a back, wherein the first and second sides having a pin for sliding within the glide mechanism.

2. The fiber tray of claim 1, wherein the glide mechanism having a curved path at the first end and the second end; and a straight path that extends from the first end to the second end in the glide mechanism.

3. The fiber tray of claim 2, wherein the glide mechanism further includes vertical paths extending from an end of each curved path to the straight path.

4. The fiber tray of claim 1, wherein the curved path is a c-shaped path with a first end and a second end.

5. The fiber tray of claim 1, wherein the glide mechanism further comprising a projection at a first end of the curved path for controlling the removal and installation of the drawer from the housing.

6. The fiber tray of claim 1, wherein the glide mechanism includes a primary stopping wall for stopping the drawer when it is fully extended and a secondary restraining wall for preventing the drawer from prematurely entering the curved path.

7. The fiber tray of claim 6, wherein the primary stopping wall, the secondary restraining wall and the curved path control and maintain the movement of the drawer.

8. The fiber tray of claim 1, wherein the glide mechanism includes a primary stopping wall at the first end and the second end and a straight path extending between the primary stopping walls at each end.

* * * * *